United States Patent
Fujji et al.

[19]

[11] Patent Number: 5,916,363
[45] Date of Patent: Jun. 29, 1999

[54] ORIENTED MOLYBDENUM OR TUNGSTEN SINGLE CRYSTAL AND MANUFACTURING METHOD THEREOF

[75] Inventors: Tadayuki Fujji; Kinichi Honda, both of Ibaraki, Japan

[73] Assignee: National Research Institute for Metals, Ibaraki, Japan

[21] Appl. No.: 08/890,005

[22] Filed: Jul. 8, 1997

[51] Int. Cl.⁶ .................................................. C30B 1/06

[52] U.S. Cl. .................... 117/4; 117/3; 117/7; 117/10; 117/6; 117/5; 117/929; 117/937; 420/429; 420/430

[58] Field of Search .................... 117/3, 4, 7, 10, 117/6, 5, 929, 937; 420/429, 430

[56] References Cited

U.S. PATENT DOCUMENTS 4,491,560  1/1985  Fujii ........................................ 420/429
5,540,182  7/1996  Levinson ..................................... 117/4

FOREIGN PATENT DOCUMENTS 61-6197   1/1986  Japan .

*Primary Examiner*—Robert Kunemund
*Attorney, Agent, or Firm*—Wenderoth, Lind & Ponack, L.L.P.

[57] ABSTRACT

Secondary recrystallized grains having a plurality of crystal orientations in a polycrystalline compact of molybdenum or tungsten, which contains at least one element selected from the group consisting of calcium and magnesium in amount of 0.007 to 0.090 atom %, are formed by locally heating an end portion(s) of the polycrystalline compact. Some grains, which have a prescribed crystal orientation, selected from these secondary recrystallized grains are subsequently grown in the whole polycrystalline compact by annealing.

8 Claims, 4 Drawing Sheets

Fig. 4A
Fig. 4E
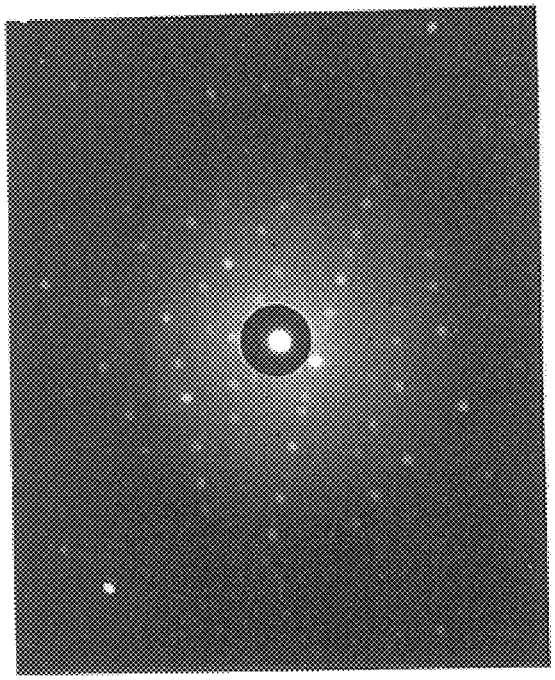
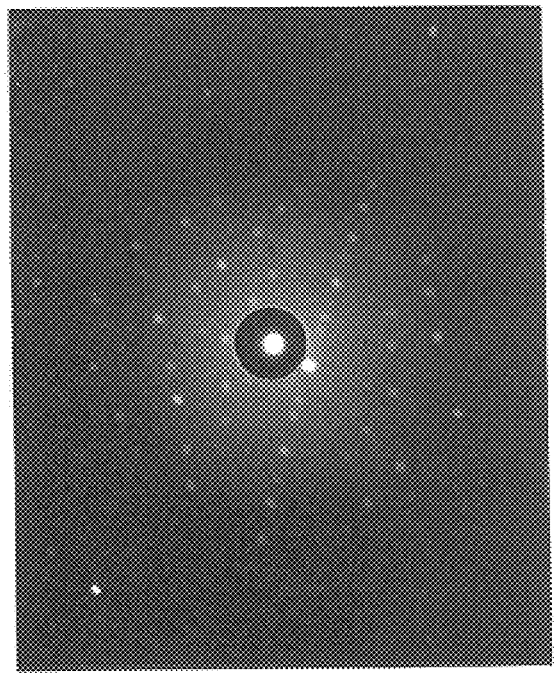

ORIENTED MOLYBDENUM OR TUNGSTEN SINGLE CRYSTAL AND MANUFACTURING METHOD THEREOF

FIELD OF THE INVENTION

The present invention relates to oriented molybdenum or tungsten single crystals and a manufacturing method thereof More particularly, the present invention relates to oriented molybdenum or tungsten single crystals and a manufacturing method thereof, the oriented molybdenum or tungsten single crystals being useful for thermoelectric power generation devices, such as a collector or an emitter, and heat-resistant materials such as a bottom plate for calcination of ceramics or deoxidation of uranium.

DISCLOSURE OF THE PRIOR ART

Molybdenum and tungsten have been conventionally known to be one of the most useful high heat-resistant metals for members of a nuclear reactor, a bottom plate for calcination of ceramics or deoxidation of uranium, a heating element, a reflecting plate for high temperature, and structural materials such as a boat or a crucible. This is because molybdenum and tungsten can resist high temperature more than 2000° C. in a non-oxidizing atmosphere and show an excellent high-temperature strength property.

However, crystal grains of polycrystalline substances of molybdenum or tungsten are coarsened in accordance with high-temperature annealing and the polycrystalline substances become brittle. Molybdenum and tungsten cannot exhibit their high heat-resistant property sufficiently, and therefore there are some limitations to practical application of them.

Polycrystalline substances of molybdenum or tungsten, crystal grains of which are intentionally coarsened by recrystallization, and single crystalline substances have been developed to eliminate such defects of polycrystalline substances of molybdenum and tungsten. Grain boundary brittleness, i.e., recrystallization brittleness, which was a hurdle against application of molybdenum and tungsten to structural materials, is being solved.

Single crystalline substances of molybdenum and tungsten, on the other hand, have attracted attention as a functional material. Their application to a collector or an emitter for thermoelectric power generation, a substrate for semiconductors, an electric contact and a laser reflecting mirror has been studied. It is necessary to produce oriented single crystals of molybdenum and tungsten, which has a particular crystal orientation, for these functional materials. Crystallographic orientations of molybdenum and tungsten are not fixed at prescribed ones by the conventional single crystal growth method. Physical, chemical and mechanical properties derived from anisotropy between crystal orientations, which are necessitated for single crystal materials, do not only exhibit sufficiently but also do not meet demands for single crystal materials having a particular crystal orientation.

A melting method has been known as a single crystal growth method for molybdenum and tungsten, in which an oriented single crystal is grown by melting and connecting a seed crystal with a raw material. The conventional single crystal growth methods by melting, which include ordinary melting methods, such as a zone melting method, as well as the melting method above-mentioned have some limitations to the scale of manufacture and the shape of single crystals. These conventional single crystal growth methods also have some defects in that a high level of technique for the manufacture of single crystals is required.

SUMMARY OF THE INVENTION

The present invention has an object to eliminate a process which requires a high technique such as seeding in the conventional melting method and easily manufacture single crystals of molybdenum and tungsten without any limitation to the scale of manufacture and the shape of single crystals. Another object of the present invention is to provide oriented molybdenum and tungsten single crystals having flexibility in the manufacturing scale and the shape of single crystals and to provide a manufacturing method of the oriented single crystals of molybdenum or tungsten.

These and other objects, features, and advantages of the invention will become more apparent upon a reading of the following detailed description and drawings.

BRIEF DESCRIPTION OF THE DRAWINGS

FIGS. 4A and 4E are photos showing an X-ray Laue image of a crystal orientation of the projection (A) and a raw substance (E), respectively.

EMBODIMENTS

In the present invention, oriented single crystals having a prescribed crystal orientation are produced in accordance with the following process:

<1> A polycrystalline metallic compact is made of molybdenum or tungsten, to which at least one element selected from the group consisting of calcium and magnesium in amount of 0.007~0.090 atom % is added.

More specifically, calcium oxide powders and/or magnesium oxide powders are added to pure molybdenum powders or pure tungsten powders in amount of 0.007~0.090 atom %, which is calculated in terms of a calcium or magnesium element. A sintered compact made of the mixed raw powders is produced as an ingot by way of powder metallurgy process, i.e., a series of mixing, compacting and sintering.

<2> Secondary recrystallized grains having a plurality of crystal orientations are formed in a shaped compact, which is subjected to hot or cold working, by locally heating an end portion(s) of the compact.

Figure 1:
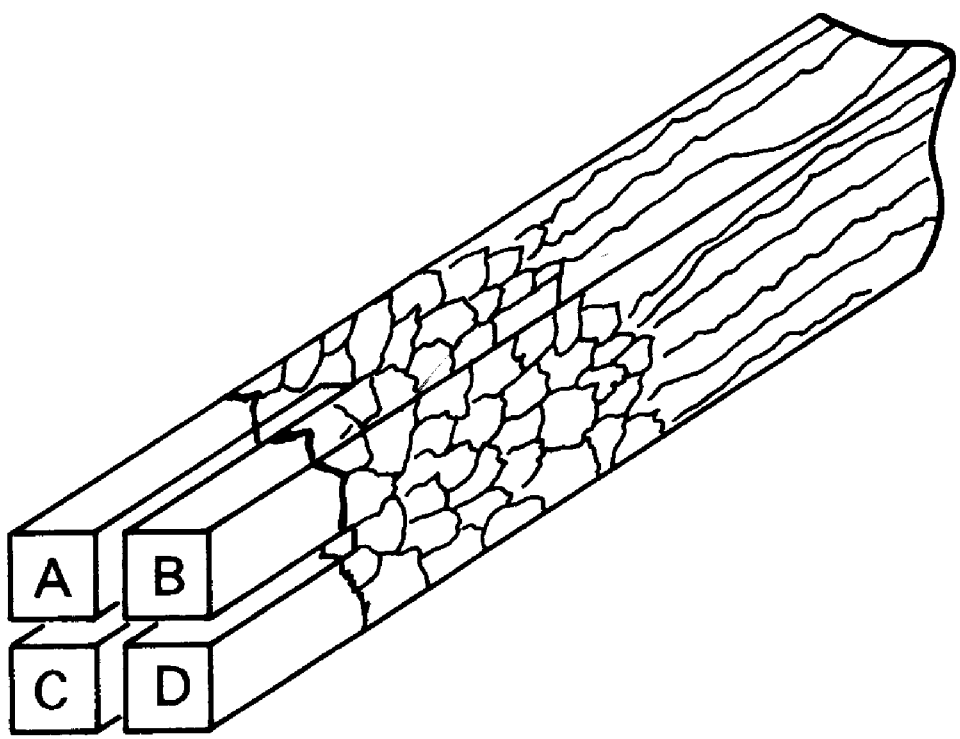
FIG. 1 is a perspective view depicting a specimen, an end portion of which is divided by a cross notch into four pieces and four projections produced being locally heated to form secondary recrystallized grains.
Figure 2A:
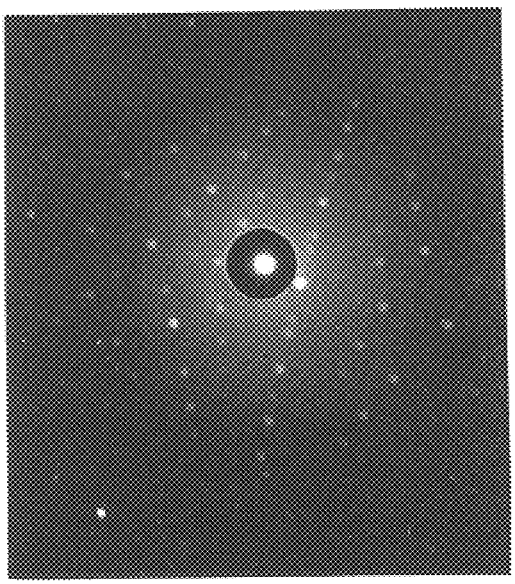
FIGS. 2A, 2B, 2C, and 2D are photos showing an X-ray Laue image of crystal orientation of secondary recrystallized grains formed in a projection, respectively.
Figure 2B:
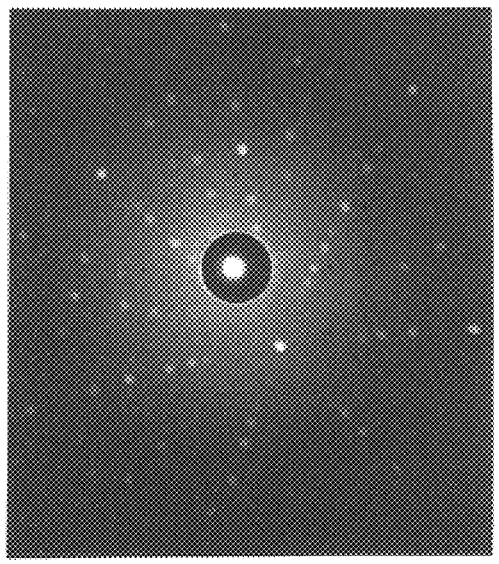
Figure 2C:
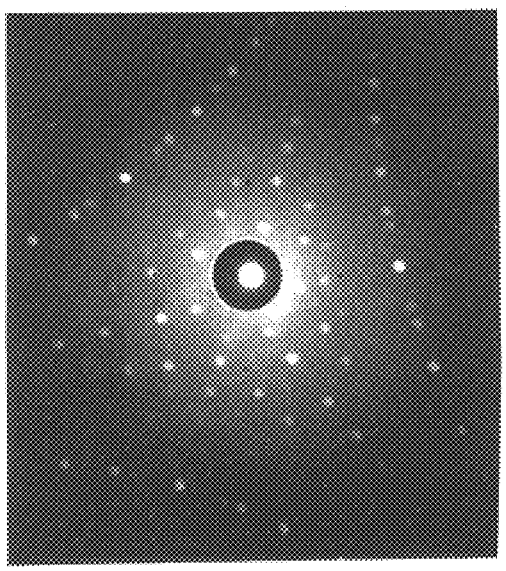
Figure 2D:
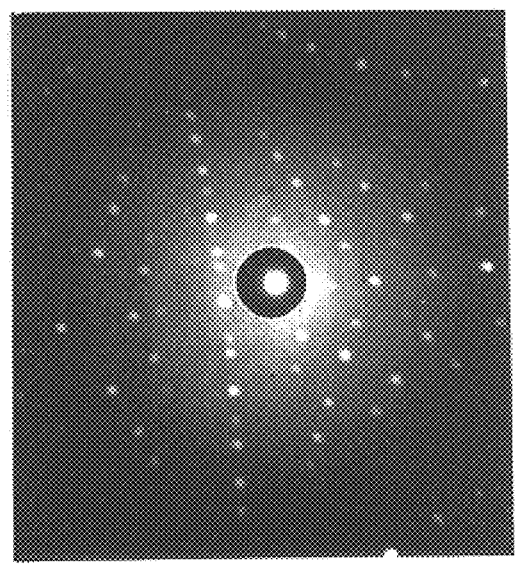

More specifically, as depicted in FIG. 1, a plurality of projections (A, B, C and D) are formed at an end portion(s) of the compact by mechanically notching the end portion(s). Secondary recrystallized grains having a plurality of crystal orientations which are different in every projection are formed by locally heating these projections (A, B, C, and D).

Figure 3:
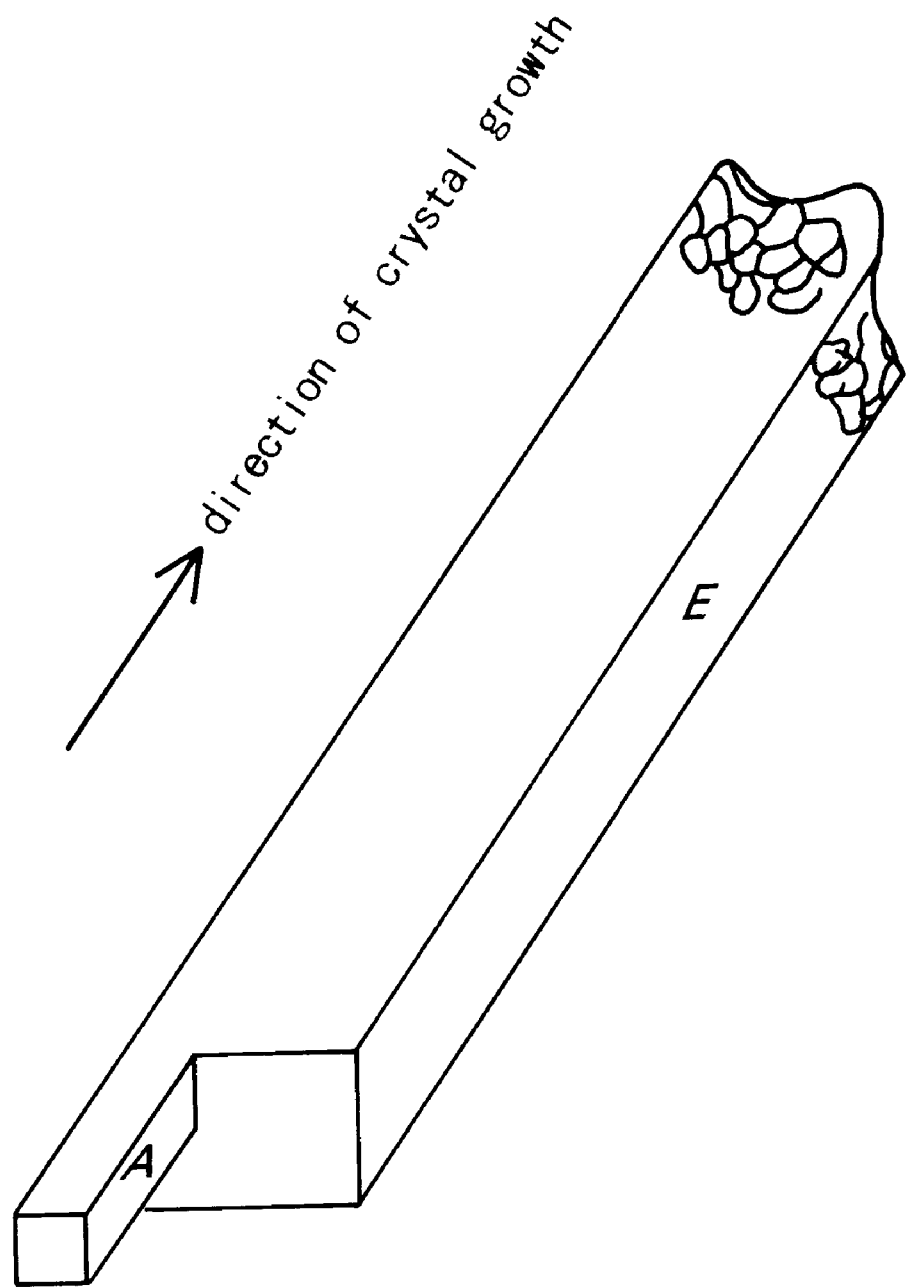
FIG. 3 is a perspective view depicting a whole polycrystalline compact when crystal grains having a prescribed crystal orientation grow in the compact.

<3> Crystal grains having a prescribed crystal orientation are chosen by an X-ray Laue diffraction method. As depicted in FIG. 3, a projection(s) in which secondary recrystallized grains have a prescribed orientation is left by eliminating the other projections not having the prescribed orientation.

<4> A whole raw substance, i.e., a polycrystalline compact, which involves the remaining projection(s), is annealed. Crystal grains having a prescribed crystal orientation invade and grow in the whole raw substance. An oriented molybdenum or tungsten single crystal is thus produced.

As is clear in the above, technology of the present invention may be defined to be an oriented single crystal growth method according to a solid phase reaction. The secondary recrystallized grains play a roll as seed crystals in the process of crystal growth. In theory, the secondary recrystallized grains, radii of which fall in the range of twice or three times as large as those of primary recrystallized grains, are possible to grow. Calcium and magnesium added to molybdenum and tungsten are metallurgical factors to promote growth of seed crystals. The range of addition of these additives should be taken as an appropriate one by considering that secondary recrystallized grains grow sufficiently.

The shape of projections is not restricted to a modification illustrated in FIG. 1. The shape may be like a wire, for example. Notches formed into the end portion(s) of the compact may also be fine slits.

At any rate, it has been unknown that single crystal growth along the crystal orientation of secondary recrystallized grains formed in a projection(s) takes place in the whole polycrystalline compact and that a crystal orientation of molybdenum and tungsten is possible to be controlled.

Now, the present invention will be described more in detail by way of examples.

EXAMPLES

Calcium oxide powders and magnesium oxide powders were added to molybdenum oxide powders or tungsten oxide powders in amount of 0.007~0.090 atom %, which is calculated in terms of calcium and magnesium. The mixture was made into metal powders by powder metallurgy method. The metal powders were formed into a compact by compressing them at pressure of 3 ton/cm$^2$. The compact was sintered for 10 hours in a hydrogen atmosphere of 1600~2000° C. The sintered compact was subjected to hot working at 1200~1600° C. and warm working at 600~1000° C., subsequently. A rolled raw substance, final rolling reduction rate of which was more than 70%, was thus produced.

A specimen having a shape like a rectangular solid bar, the thickness, width and length of which was 5~10 mm, 5~10 mm, and 50~100 mm, respectively, was mechanically cut out from the rolled raw substance. An end portion of the specimen was divided into four pieces by a cross notch of 10~15 mm, which extends in the direction of the length of the specimen, to form four projections (A, B, C and D). Four kinds of secondary recrystallized grains, i.e., seed crystals, were produced by heating the projections with condensed optical beams for 30 minutes at 2000~2300° C.

A projection (A) having a prescribed crystal orientation was chosen in accordance with X-ray Laue diffraction images as shown in FIG. 2. After eliminating the other projections (B, C and D), the whole specimen (A and E) was annealed at 2000~2300° C. by irradiating it with optical beams.

As is shown in FIG. 4, it is confirmed that the crystal orientation of the specimen (E) corresponds with that of the projection (A) and that a single crystal having a prescribed crystal orientation was made.

As described in detail in the above, according to the present invention, particular grains having a prescribed crystal orientation grow easily.

Oriented molybdenum or tungsten single crystals are available as a functional material for a wide range of technological fields, which require properties of a single crystal substance having a particular crystal orientation, for example, a collector or an emitter for thermoelectric power generation, a substrate of semiconductors, an electric contact, and a laser reflecting mirror. No change in a metallic structure or no grain boundary sliding occurs in the oriented molybdenum or tungsten single crystals and therefore recrystallization brittleness will not take place. The oriented molybdenum or tungsten single crystals are excellent in high-temperature strength and are consequently available for heat-resistant structural materials such as members of a nuclear reactor, a bottom plate for calcination of ceramics or deoxidation of uranium, a heating element and a reflecting plate.

It is needless to mention that the present invention is not restricted to the above-mentioned examples.

What is claimed is:

1. A method of manufacturing oriented molybdenum or tungsten single crystals, which comprises forming a plurality of projections at an end portion(s) of a polycrystalline compact containing at least one element selected from the group consisting of calcium and magnesium in amount of 0.007 to 0.090 atom %, by mechanically notching the end portion(s), forming secondary recrystallized grains having a plurality of crystal orientations which are different from each other in the polycrystalline compact by locally heating each of said projections, maintaining at least one projection, in which said secondary recrystallized grains have a prescribed crystal orientation, and eliminating the other projections not having said prescribed crystal orientation, and annealing the whole polycrystalline compact, which involves a remaining projection(s), to grow grains having the prescribed crystal orientation.

2. The method of manufacturing oriented molybdenum or tungsten single crystals as claimed in claim 1, wherein each of said projections is locally heated by condensed optical beams and secondary recrystallized grains, crystal orientations of which are different in every projection, are produced.

3. The method of manufacturing oriented molybdenum or tungsten single crystals as claimed in claim 1, wherein secondary recrystallized grains having a prescribed crystal orientation are chosen by an X-ray Laue diffraction method.

4. The method of manufacturing oriented molybdenum or tungsten single crystals as claimed in claim 2, wherein secondary recrystallized grains having a prescribed crystal orientation are chosen by an X-ray Laue diffraction method.

5. The method of manufacturing oriented molybdenum or tungsten single crystals as claimed in claim 1, wherein the whole polycrystalline compact is subjected to annealing under a temperature range of 2000 to 2300° C.

6. The method of manufacturing oriented molybdenum or tungsten single crystals as claimed in claim 2, wherein the whole polycrystalline compact is subjected to annealing under a temperature range of 2000 to 2300° C.

7. The method of manufacturing oriented molybdenum or tungsten single crystals as claimed in claim 3, wherein the whole polycrystalline compact is subjected to annealing under a temperature range of 2000 to 2300° C.

8. The method of manufacturing oriented molybdenum or tungsten single crystals as claimed in claim 4, wherein the whole polycrystalline compact is subjected to annealing under a temperature range of 2000 to 2300° C.

* * * * *